United States Patent
Shimadu et al.

(10) Patent No.: US 6,909,653 B2
(45) Date of Patent: Jun. 21, 2005

(54) MEMORY INTEGRATED CIRCUIT DEVICE HAVING SELF RESET CIRCUIT FOR PRECHARGING DATA BUSES BASED ON THE DETECTION OF THEIR DISCHARGE LEVELS

(75) Inventors: Daisuke Shimadu, Kodaira (JP); Hiroshi Toyoshima, Akiruno (JP); Masahiko Nishiyama, Ome (JP)

(73) Assignees: Renesas Technology Corporation, Tokyo (JP); Hitachi ULSI Systems Co., Ltd., Tokyo (JP)

( * ) Notice: Subject to any disclaimer, the term of this patent is extended or adjusted under 35 U.S.C. 154(b) by 209 days.

(21) Appl. No.: 10/452,273

(22) Filed: Jun. 3, 2003

(65) Prior Publication Data
US 2005/0047232 A1 Mar. 3, 2005

(30) Foreign Application Priority Data
Jun. 10, 2002 (JP) ...................... 2002-168237

(51) Int. Cl.[7] .............................. G11C 7/00
(52) U.S. Cl. ...................... 365/203; 365/198
(58) Field of Search ............. 365/203, 189.05, 365/198, 185.13

(56) References Cited

U.S. PATENT DOCUMENTS 6,504,774 B2 * 1/2003 Yoon et al. ............... 365/203
6,778,447 B2 * 8/2004 Hsu et al. ............... 365/189.08

FOREIGN PATENT DOCUMENTS

| JP | 61-144788 | 12/1984 |
| JP | 5-047180 | 8/1991 |

OTHER PUBLICATIONS

Geordie Braceras, Alan Roberts, John Connor, Reid Wistort, Terry Frederick, Marcel Robillard, Stu Hall, Steve Burns and Matt Graf, "A 940 MHz Data–Rate 8Mb CMOS SRAM", 1999 IEEE International Solid–State Circuits Conference, 2 pages.

* cited by examiner

*Primary Examiner*—Van Thu Nguyen
(74) *Attorney, Agent, or Firm*—Reed Smith LLP; Stanley P. Fisher, Esq.; Juan Carlos A. Marquez, Esq.

(57) ABSTRACT

The invention provides a semiconductor integrated circuit device having a signal transmission path realizing high speed and low power consumption with a simple configuration. The device has a signal transmission path for transmitting a signal by discharging one of first signal lines corresponding to complementary input signals in a plurality of first signal lines precharged by a precharge circuit, and a self reset circuit for detecting the discharge level of the pair of signal lines corresponding to the complementary signals out of the plurality of first signal lines and operating the precharge circuit at a timing later than the period of discharging.

17 Claims, 17 Drawing Sheets

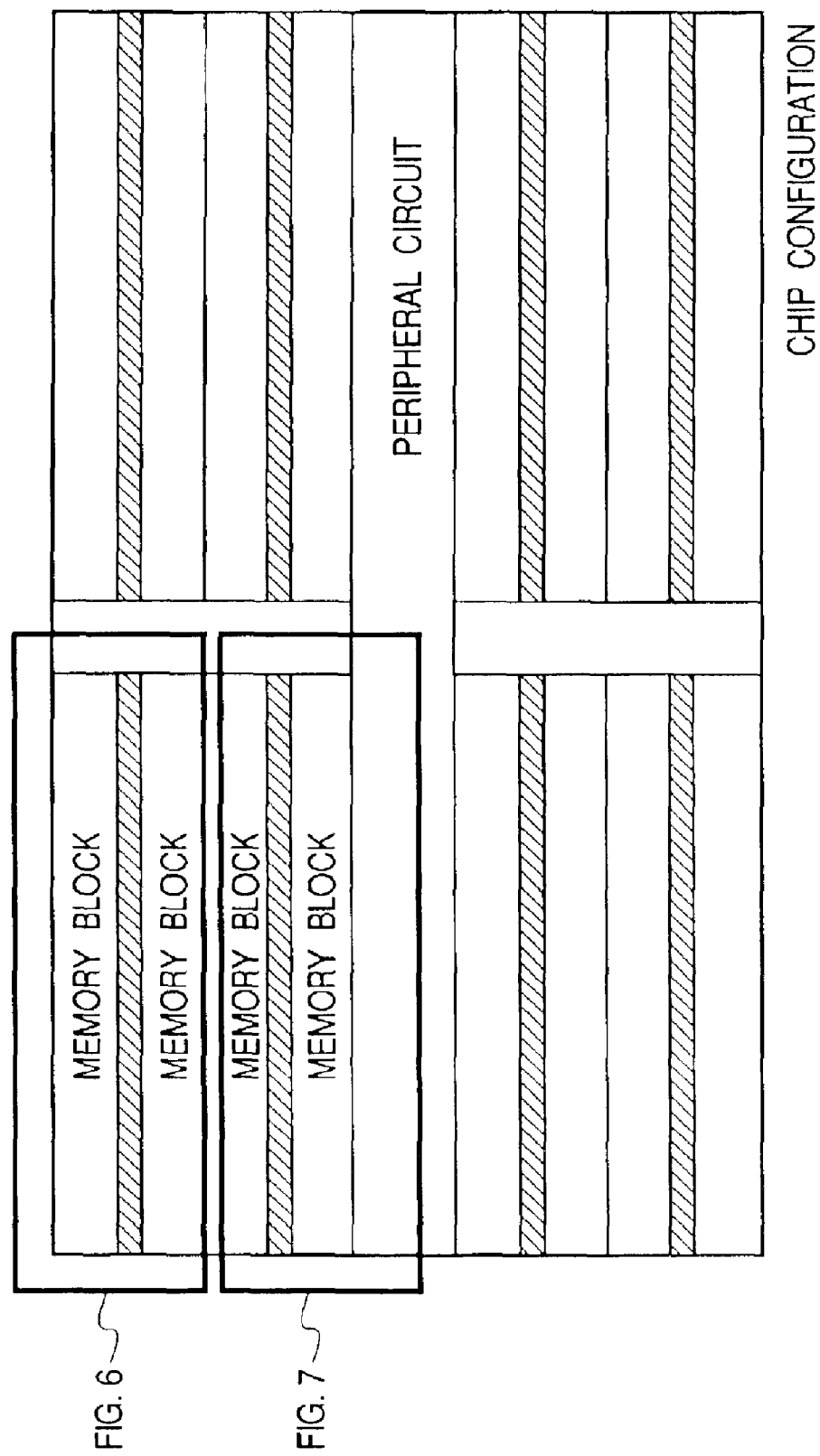

MEMORY INTEGRATED CIRCUIT DEVICE HAVING SELF RESET CIRCUIT FOR PRECHARGING DATA BUSES BASED ON THE DETECTION OF THEIR DISCHARGE LEVELS

BACKGROUND OF THE INVENTION

The present invention relates to a semiconductor integrated circuit device and, more particularly, to a technique effectively used for a device having a self-reset signal bus enabling high-speed signal transmission.

Through investigation of known arts after achieving the present invention, (1) Japanese Unexamined Patent Publication No. Sho 61 (1986)-144788, (2) Japanese Unexamined Patent Publication No. Hei 5 (1993)-047180, and (3) "A 940 MHz Data-Rate 8 Mb CMOS SRAM (1999 IEEE International Solid State Circuits Conference) were reported. The publication (1) discloses a semiconductor memory device capable of performing operation of automatically precharging a data output line after completion of data output with reliability by generating a reading end confirmation clock after lapse of predetermined time since an output of a data output buffer was received. The publication (2) discloses a semiconductor memory device of comparing and determining amplification levels of complementary input signals supplied to an amplification circuit for amplifying a read signal having a small amplitude by a comparison control and, on the basis of the comparison and determination, generating equalize/precharge signals to automatically equalize/precharge an output signal of the amplification circuit. In the literature (3), a timing of resetting a read data bus by a self reset circuit constructed by a buffer circuit, a delay circuit, and a reset circuit is generated from an output of a read data bus signal.

SUMMARY OF THE INVENTION

The techniques (1) and (2) are directed to reset or precharge the signal output line side but are not directed to precharge the signal transmission line itself. In the literature (3), the self reset circuit for the read data bus is connected to each of read data bus lines. Consequently, when the number of read data bus lines is large, the number of self reset circuits is also large accordingly. For example, in a data bus for transferring read data of 9 bits, 18 self reset circuits are required. Consequently, a read data bus has to be disposed according to the layout of the self reset circuits and it results in increase in the chip size or increase in power consumption. Further, it was found that since both of the reset start timing and reset period are set by a delay circuit, a predetermined limitation exists in increase in the speed of a bus cycle.

An object of the invention is to provide a semiconductor integrated circuit device having a signal transmission path realizing high speed and low power consumption with a simple configuration. The above and other objects and novel features of the invention will become apparent from the description of the specification and the appended drawings.

An outline of a representative invention out of inventions disclosed in the specification will be described briefly as follows. A semiconductor integrated circuit device is provided with a signal transmission path for transmitting a signal by discharging one of first signal lines corresponding to complementary input signals in a plurality of first signal lines precharged by a precharge circuit, and a self reset circuit for detecting the discharge level of the pair of signal lines corresponding to the complementary signals out of the plurality of first signal lines and operating the precharge circuit at a timing later than the period of discharging.

BRIEF DESCRIPTION OF THE DRAWINGS

FIG. 5 is a chip configuration diagram showing an example of an SRAM to which the invention is applied.

DESCRIPTION OF PREFERRED EMBODIMENTS OF THE INVENTION

Figure 1:
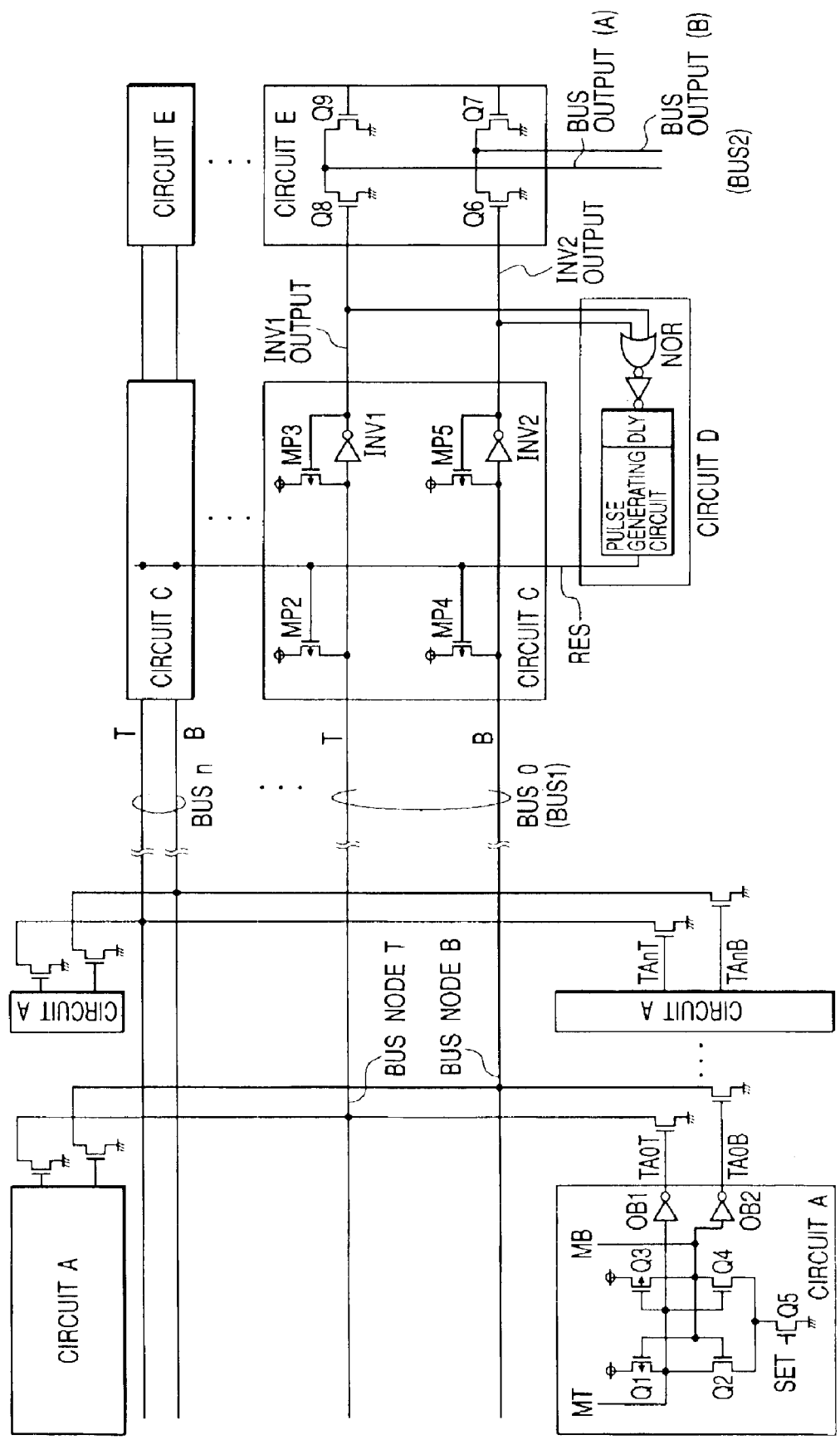
FIG. 1 is a circuit diagram showing an example of a signal transmission path of a semiconductor integrated circuit device according to the invention.

FIG. 1 is a circuit diagram showing an example of a signal transmission path of a semiconductor integrated circuit device according to the invention. The example is directed to a signal transmission path for transmitting a signal generated by a circuit A to a circuit E via a first data bus BUS1. The circuit A includes an amplification circuit for amplifying complementary signals MT and MB to be transmitted. The amplification circuit includes two CMOS inverter circuits constructed as a latch circuit by P-channel MOSFETs Q1 and Q3 and N-channel MOSFETs Q2 and Q4 whose inputs and outputs are cross-coupled, and an N-channel MOSFET Q5 for passing operation current to the latch circuit by an operation control signal SET.

The complementary signals MT and MB are, though not limited, signals having small amplitudes read from static memory cells. Specifically, the complementary signals MT and MB are signals transmitted through complementary bit lines to which the memory cells are connected via a column selection switch (Y selection circuit). Therefore, the amplification circuit performs an operation of a sense amplifier for memory cells.

Complementary amplification signals of the amplification circuit are transferred to the gates of output MOSFETs via output circuits OB1 and OB2. The drains of the output MOSFETs are connected to bus nodes T and B of a bus 0. To the bus nodes T and B, drains of similar output MOSFETs from the other circuits A are commonly connected. The output MOSFET is an output circuit of an open drain type and a wired logic is obtained in the bus 0. The first data bus BUS1 is constructed by buses 0 to n each consisting of a pair of complementary signal lines of true T and bar B. Consequently, the number of signal lines is equal to (n+1)×2.

On the memory side, an amplification circuit (sense amplifier) as one of the plurality of circuits A corresponding to the bus 0 is made operative by the signal SET and signals TA0A and TA0B are transmitted to the bus nodes T and B of the bus 0 via the output MOSFETs. At this time, in the other circuits A connected to the bus 0, the corresponding signal SET enters a not-selected state of the low level, signals corresponding to the signals TA0A and TA0B become the low level, the output MOSFETs are turned off, and an output high impedance state is set, thereby sending an amplification signal on the selected one memory side to the bus 0.

A plurality of circuits A similar to the above are provided also in the remaining "n" pairs of buses of the bus 1 (not shown) to the bus n. n+1 circuits A are grouped as a set. A plurality of sets are provided for the first data bus BUS1. By the signal SET, the circuits A are made operative on a set unit basis and an operation of transferring data of (n+1) bits is performed via the first data bus BUS1.

For the first data bus BUS1, a circuit C is provided. The circuit C is provided for each of the buses 0 to n and is constructed by a relay amplification circuit and a precharge circuit. The precharge circuit is constructed by, as representatively illustrated in the bus 0, P-channel MOSFETs MP2 and MP4 provided between the power source voltage and the signal lines of true T and bar B, respectively, of each of the buses 0 to n. The relay amplification circuit is constructed by CMOS inverter circuits INV1 and INV2 as representatively shown in the bus 0. Output signals of the CMOS inverter circuits INV1 and INV2 are fed back to the gates of P-channel MOSFETs MP3 and MP5 provided between the signal lines of true T and bar B of the bus 0 and the power source voltage.

The MOSFETs MP3 and MP5 are provided to maintain the precharge level of the bus nodes T and B. Therefore, when one of the bus nodes T and B of the bus 0 or the like is discharged by the output MOSFETs, the MOSFETs MP3 and MP5 have only small conductance so that the bus node T or B is set to the low level by the MOSFET which is turned on. In other words, the MOSFETs MP3 and MP5 have current supplying capability sufficient to compensate decrease in the current in the bus node B or T floated due to a leak current or the like, by the output MOSFET which is turned off by the amplifying operation of the sense amplifier. Specifically, in a signal transmission period, when the bus node B or T in the bus 0 is set to the precharge level, an output signal of the inverter circuit 1 or 0 becomes the low level and the P-channel MOSFET MP5 or MP3 is turned on, thereby maintaining the precharge level.

For the n+1 precharge circuits and relay amplification circuits, in other words, for the first data bus BUS1, one circuit D is provided. The circuit D serves as a reset control circuit for receiving output signals of one of the plurality of relay amplification circuits, for example, the relay amplification circuit INV1 or INV2 corresponding to the bus 0 and generating a reset signal RES to be supplied to the gate of the MOSFET MP2 or MP4 constructing the precharge circuit.

The reset control circuit D generates a signal of delay time corresponding to the discharge period of the bus 0 by a delay circuit DLY in response to an output of the relay amplification circuit corresponding to a discharge signal of the true T or bar B of the bus 0 of the first data bus BUS1 consisting of n+1 pairs of buses, and generates the reset signal RES for operating the precharge circuit after lapse of the delay time. Although not particularly limited, a pulse generating circuit receives an output signal of the delay circuit DLY, generates a pulse corresponding to the precharge period, and controls an active period (precharge period) of the reset signal RES.

In the example, the circuit E corresponding to the true T and the bar B of the bus 0 in the first data bus BUS1 as representatively shown is constructed by two pairs of MOSFETs Q8 and Q9 and MOSFETs Q6 and Q7 whose drains are connected to a second data bus BUS2. Output signals of the relay amplification circuits INV1 and INV2 of the first data bus BUS1 are supplied to the gates of the MOSFETs Q8 and Q6 as one of the two MOSFETs Q8 and Q9 and one of the two MOSFETs Q6 and Q7, respectively, provided for the second data bus BUS2. To the gates of the MOSFETs Q9 and Q7 paired with the MOSFETs Q8 and Q6, respectively, a transfer signal from a data bus similar to the first data bus BUS1 is sent.

Consequently, the circuit E allows a wired OR logic of transmission signals in the two portions of the first data bus BUS1, which are disposed on the right and left sides of the circuit E. That is, the circuit E performs the same operation as that of the output MOSFET provided for the first data bus BUS1. Therefore, although not shown, also in the second data bus BUS2, a precharge circuit and a relay amplification circuit like the circuits C and D and a commonly used reset control circuit are provided, thereby constructing the self reset circuit for the first data bus BUS.

Figure 2:
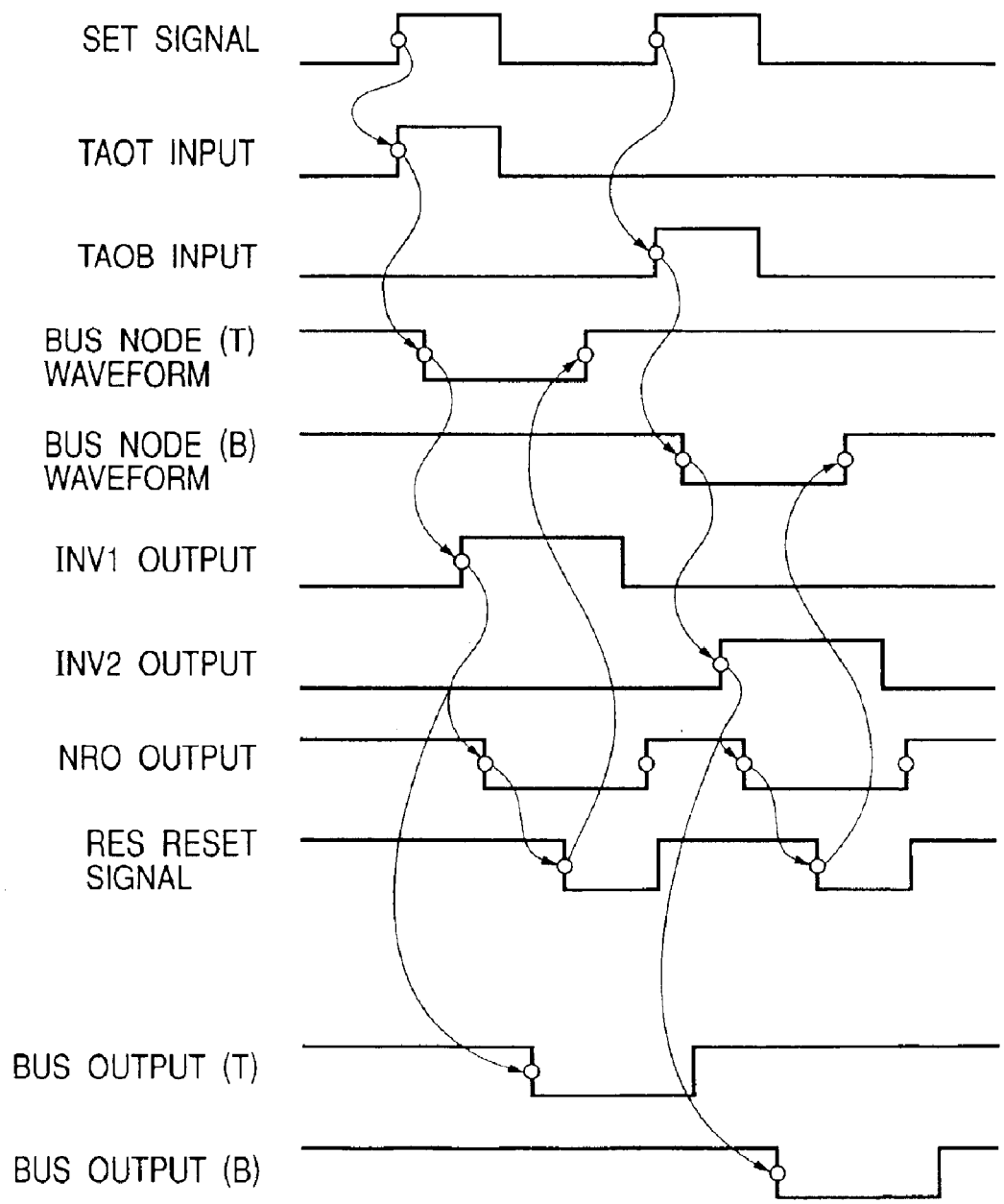
FIG. 2 is a waveform chart for explaining the operation of the signal transmission path according to the invention.

FIG. 2 is a waveform chart for explaining the operation of the signal transmission path according to the invention. In the circuit A, when the signal SET goes high, the amplification circuit as the sense amplifier is made operative to amplify the read signals MT and MB having small amplitudes from the input memory cell. In the first reading operation, for example, the signal TA0T as one of complementary signals is set to the high level and the other signal TB0B at the low level is unchanged.

By the high level of the signal TA0T, the bus node T of the bus 0 is discharged from the high level to the low level. In response to the discharge to the low level of the bus node T, an output signal of the inverter circuit INV1 changes to the high level. In response to the high level of an output signal of the inverter INV1, an output signal of a NOR gate circuit of the circuit D changes from the high level to the low level, thereby changing the reset signal RES from the high level to the low level after lapse of delay circuit in the delay circuit DLY. By the low level of the signal RES, the P-channel MOSFETs MP2 and MP4 and the like in the precharge circuit are turned on and all of the buses 0 to n in the first data bus BUS1 are precharged to the high level.

By the high level of the output signal of the inverter INV1, the MOSFET Q8 in the circuit E is turned on to perform a discharging operation of setting the output (A) of the second data bus to the low level, thereby transmitting the signal in the first data bus BUS1 to the second data bus BUS2.

In the circuit A, when the signal SET goes high again, the amplification circuit as the sense amplifier is made operative to amplify the read signals MT and MB having small amplitudes from the input memory cell. In the second reading operation, for example, the signal TA0B as the other one of the complementary signals is set to the high level, and the signal TA0T at the low level is unchanged.

By the high level of the signal TA0B, the bus node B of the bus 0 is discharged from the high level to the low level. In response to the discharge to the low level of the bus node B, an output signal of the inverter INV2 changes to the high level. In response to the high level of the output signal of the inverter INV2, an output signal of the NOR gate circuit in the circuit D changes from the high level to the low level. After lapse of delay time in the delay circuit DLY, the reset signal RES is changed from the high level to the low level. By the low level of the signal RES, the P-channel MOSFETs MP2 and MP4 and the like of the precharge circuit are turned on to precharge all of the buses 0 to n in the first data bus BUS1 to the high level.

By the high level of the output signal of the inverter INV2, the MOSFET Q6 in the circuit E is turned on to perform the discharging operation of setting the output (B) of the second data bus to the low level, thereby transmitting the signal in the first data bus BUS1 to the second data bus BUS2.

As in the embodiment, the OR logic of output signals of one bus (in this case, relay outputs INV1 and INV2 of the bus (0)) is obtained. The output is delayed by the delay circuit DLY and the resultant is used as the input signal RES of the P-channel MOSFETs MP2 and MP4 and the like constructing the precharge circuit (reset circuit) of each of the buses 0 to n in the first data bus BUS1. With such a configuration, one auto reset circuit D is sufficient for the first data bus BUS1 constructed by the n+1 pairs of the buses 0 to n. The area of the self reset circuit portion can be reduced and the operation current consumed by the delay circuit becomes ½ (n+1).

The self reset circuit of the embodiment is constructed by the circuits C and D as described above. The circuit C is constructed by an amplification circuit such as an inverter, a precharge MOSFET, and an MOSFET of a small size for maintaining the precharge level, so that the first data bus constructed by (n+1)×2 buses can be formed on a semiconductor substrate at high density. Since the circuit D can be commonly used by the n+1 circuits C, it does not exert an influence on high-density layout of the first data bus. Thus, the signal transmission path realizing simplified circuits and low power consumption can be obtained.

By disposing the buses in the first data bus BUS1 at high density, fluctuations in the output timing caused by conditions such as temperature, device performance, and power source voltage can be also reduced. Consequently, even when one bus is used as a representative and the reset signal RES is generated by the reset control circuit to precharge all of the buses 0 to n in the first data bus BUS1, the precharging operation can be performed without any substantial problem. The circuit D has a function of detecting occurrence of a difference between output voltages of the inverters INV1 and INV2. In other words, since the output voltages of the inverters INV1 and INV2 correspond to the voltages of the bus nodes T and B of the bus 0, the circuit D has the function of detecting a potential difference between a pair of lines constructing the bus 0.

Figure 3:
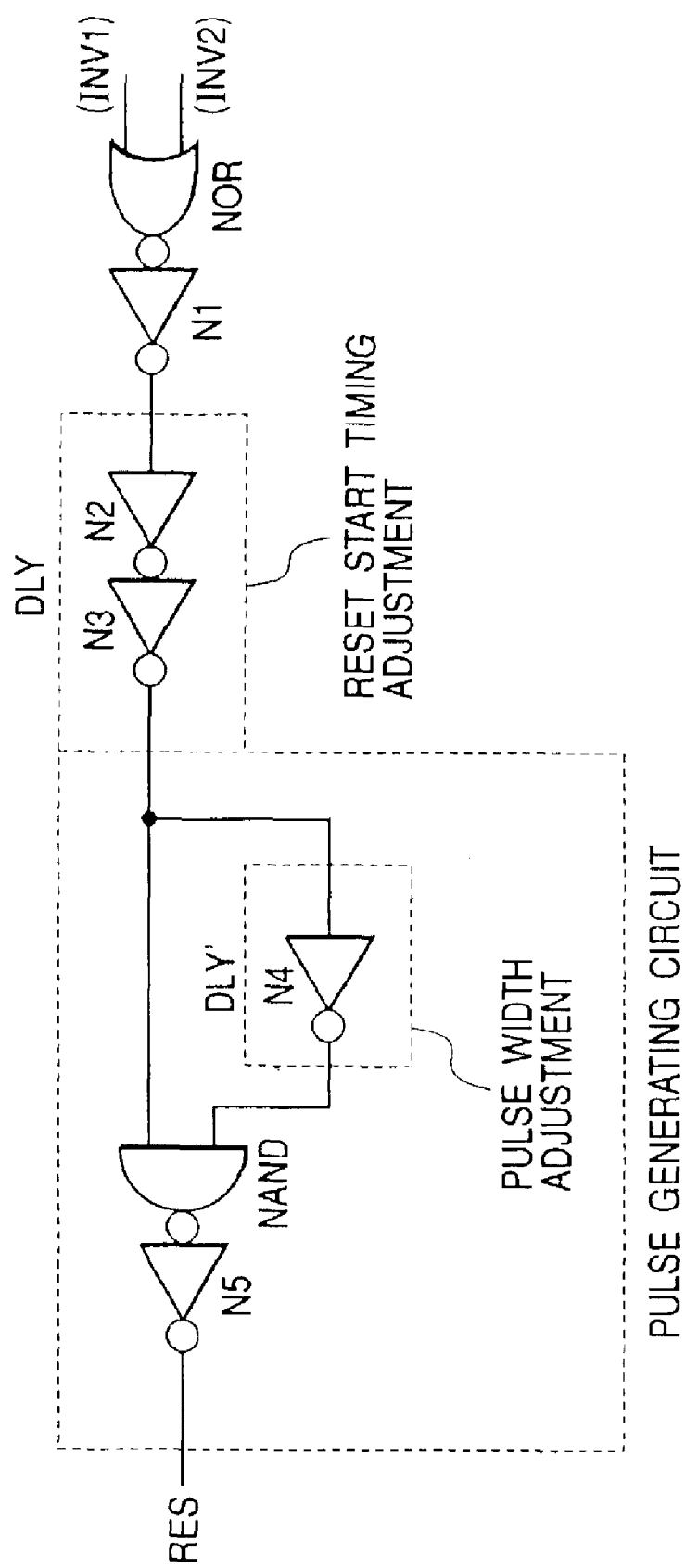
FIG. 3 is a circuit diagram showing an example of a reset control circuit provided for the signal transmission path according to the invention.

FIG. 3 is a circuit diagram showing an example of the reset control circuit provided for the signal transmission path according to the invention. The diagram corresponds to the circuit D in FIG. 1. The NOR gate circuit NOR receives output signals of the relay amplification circuits INV1 and INV2 provided for a bus, for example, the bus 0 in the first data bus BUS1 as in the first embodiment and detects a change to the high level (logic 1) of one of the output signals. On the output side of the NOR gate circuit NOR, an inverter circuit N1 is provided. The inverter circuit N1 and the NOR gate NOR construct an OR circuit.

An output of the OR circuit is delayed by two inverter circuits N2 and N3 connected in series and constructing the delay circuit DLY. By the delay time, a reset start timing is adjusted. Strictly, the delay time of the NAND circuit NAND and an inverter circuit N5 is also included. It is to be understood that delay time of the NAND gate circuit NAND and the inverter circuit N5 can be ignored as compared with the delay time of the inverter circuits N2 and N3.

Figure 4A:
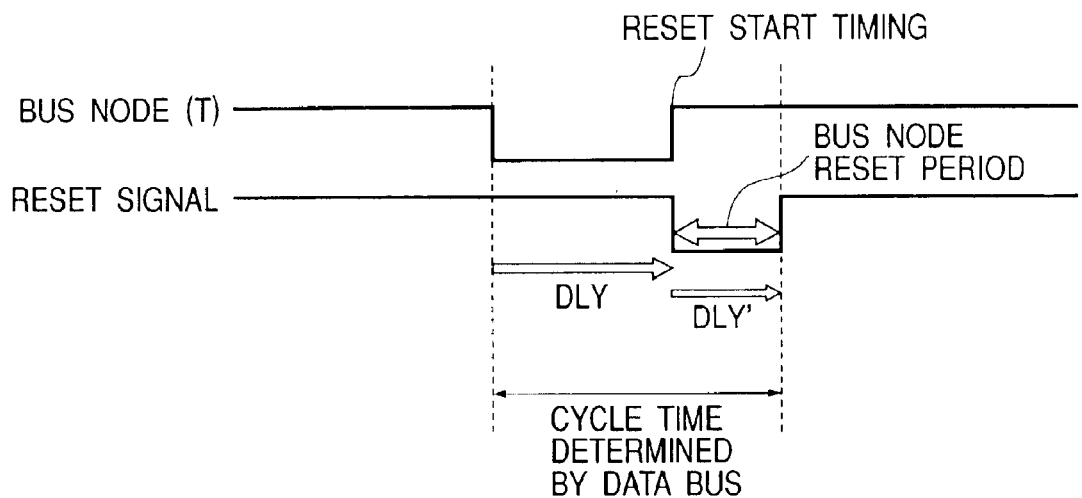
FIGS. 4A and 4B are waveform charts for explaining the operation of the reset control circuit of FIG. 3.

An output signal of the delay circuit DLY is transmitted to an inverter circuit N4 for pulse width adjustment. The inverter circuit N4 operates as a delay circuit DLY' and transmits the delay signal to the other input of the NAND gate circuit NAND. As a result, as shown in the waveform chart of FIG. 4A, the bus node T is discharged to the low level. In response to the low level, an output signal of the relay amplification circuit INV1 becomes the high level (logic 1). After lapse of the delay time in the delay circuit DLY since then, the reset signal changes to the low level. After lapse of delay time of the delay circuit DLY', the reset signal changes to the high level.

The change to the low level of the reset signal is determined by, for example, the delay time of the delay circuit DLY elapsed since the bus node T is discharged. The period in which the active level of the low level is maintained and the bus node is reset (precharged) is set by the delay circuit DLY'. By the delay circuit DLY', NAND gate circuit NAND, and inverter circuit N5, a pulse generating circuit is constructed. The reset signal RES is generated which has a pulse width corresponding to the period between the time when the delay signal of the delay circuit DLY becomes the logic 1 and the time when the delay signal of the delay circuit DLY' becomes the logic 1, in other words, the delay time of the delay circuit DLY' of the delay circuit DLY.

Figure 4B:
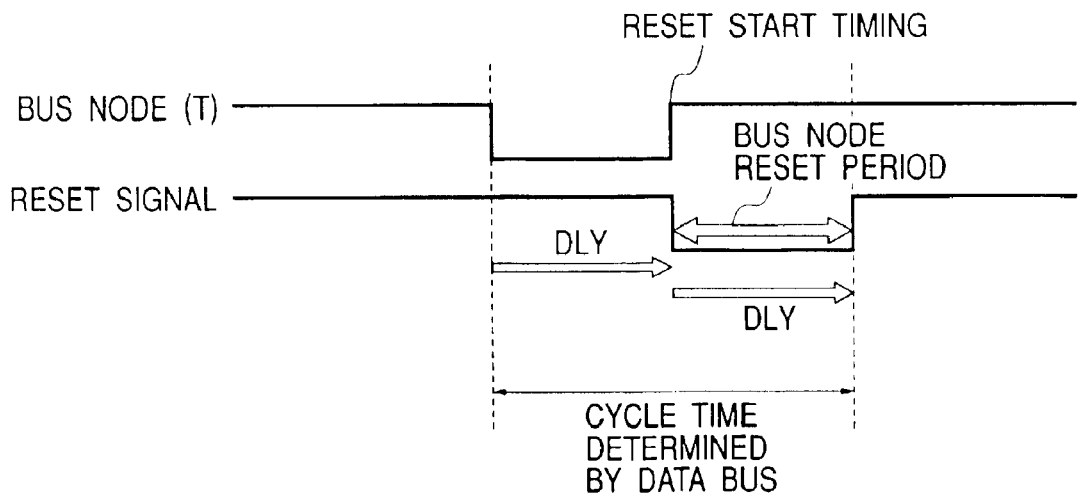

In the case where the pulse generating circuit does not exist, as shown in FIG. 4B, both the reset start timing and the bus node reset period are unconditionally determined by the delay time of the delay circuit DLY. The discharge period of the first data bus BUS1 is determined by the pulse width of the set signal SET in the first embodiment of FIG. 1. The discharge period is set to be relatively long time in consideration of the signal transmission time of the first data bus BUS1 and the operation of the latch circuit for receiving it and the like. When the precharging operation is started in the discharge period, an inconvenience such as transmission of erroneous data or passage of a direct current between the precharge MOSFETs MP2 and MP4 and the output MOSFET for discharging the first data bus BUS1 occurs. Consequently, the delay time of the delay circuit DLY has to be set to be relatively long time in consideration of the worst case. Since such delay time of the delay circuit DLY is the bus node reset period, in the configuration as shown in FIG. 4B, the cycle time becomes long.

On the other hand, the bus node reset period may be time of precharging the discharged bus node T or B to the high level such as the power source voltage. The current can be made to pass to the precharge MOSFETs MP2 and MP4 in very short time in consideration of parasitic capacitance of the bus and the like. In the embodiment, attention is paid to the fact. By providing the pulse generating circuit as described above, the bus cycle determined by the data bus can be set to short time determined by the delay time DLY at the reset start timing and the bus node reset period DLY'.

In the embodiment, the reset start timing is determined by the delay circuit DLY for adjusting the reset timing, and the bus node reset period is determined by the delay circuit DLY' for the pulse width adjustment. Consequently, independent timing designing can be realized without exerting an influence on the cycle time, so that shortening in the bus cycle, in other words, increase in speed of the operation can be achieved.

Figure 6:
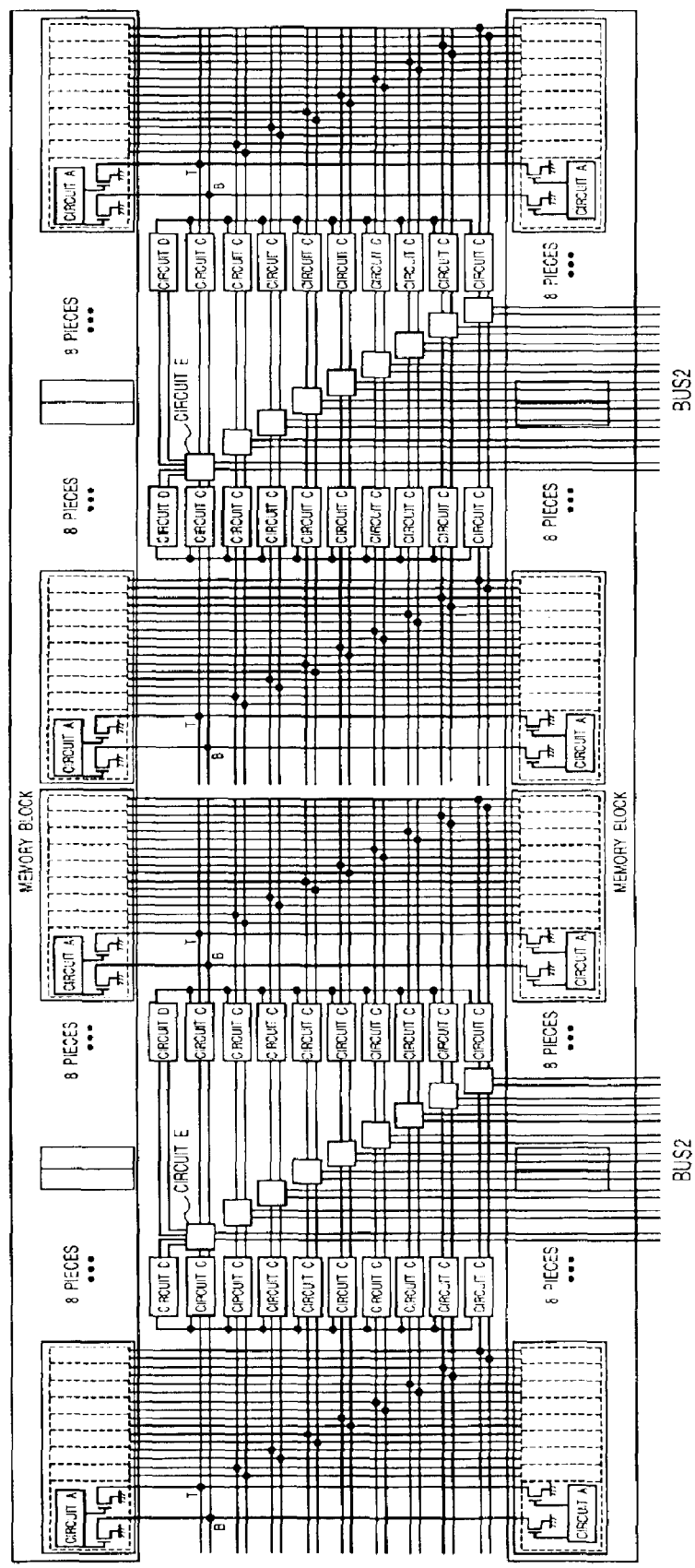
FIG. 6 is a circuit configuration diagram of two memory blocks in the upper part of a memory array in FIG. 5 and their peripheral circuits.
Figure 7:
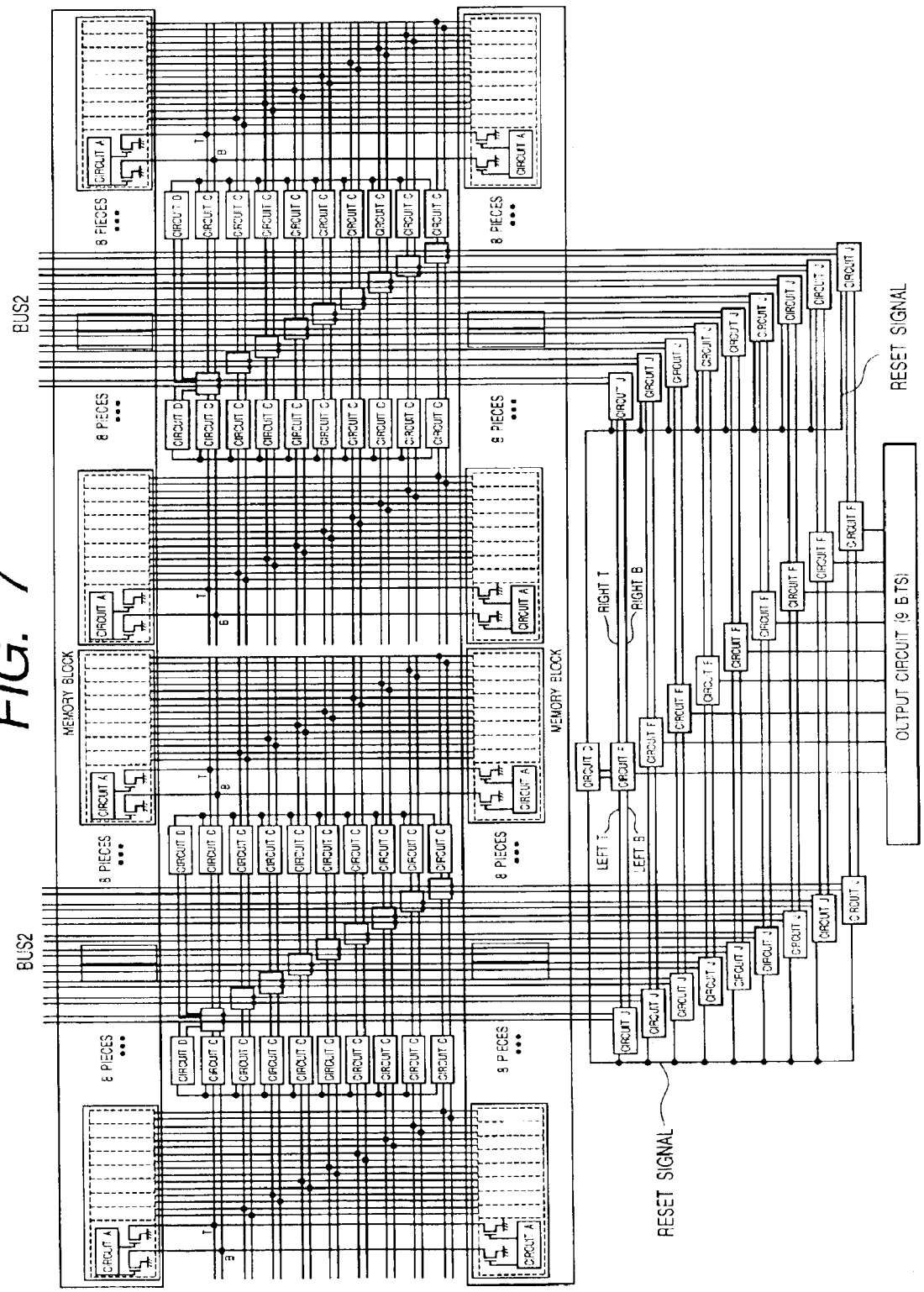
FIG. 7 is a circuit configuration diagram of two memory blocks in the lower part of the memory array in FIG. 5, their peripheral circuits, and an output circuit.

FIG. 5 is a chip configuration diagram showing an example of a static RAM (hereinbelow, called an SRAM) to which the invention is applied. In the SRAM of the embodiment, a memory array is largely divided into four portions by a peripheral circuit provided in the center portion in the vertical and horizontal directions of the chip. A representative memory array as one of the four divided portions is shown in FIGS. 6 and 7. In the drawings, the longitudinal direction of the chip is set as the lateral direction and the short direction is set as the vertical direction.

FIG. 6 shows two memory blocks in the upper part of the memory array which is largely divided into four portions in the vertical direction, and peripheral circuits corresponding to the two memory blocks. The two memory blocks in the upper part are largely divided into two portions in the lateral direction. In the left-half, a memory cell array is provided in correspondence with the circuit A. Nine circuits A as a set are provided in each of upper and lower memory blocks. Total 16 sets are provided. The eight sets of circuits A are provided while sandwiching the circuits E.

In the upper and lower memory blocks, corresponding circuits A are connected to the nine buses 0 to 8 constructing the first data bus BUS1 extending in the lateral direction. The nine pairs of signal lines extending in the lateral direction in the diagram construct the first data bus. To the buses T and B, the drains of the corresponding eight output MOSFETs are connected.

The circuits C are provided for the two right and left divided portions of the first data bus. One circuit D is provided for the nine circuits C to generate the reset signal. The circuit E receives output signals of the two sets of the circuits C corresponding to the right and left portions of the first data bus and transmits an output signal to the second data bus BUS2 extending in the vertical direction. Also in the right half of the memory block, the other first data bus and the circuits C and D are provided in the mirror configuration with respect to the left half, and the circuit E and the second data bus BUS2 are provided in the center portion in the lateral direction.

FIG. 7 shows two memory blocks in the lower part in the divided four memory blocks, peripheral circuits and an output circuit which correspond to the two memory blocks. The two memory blocks on the lower side have the configuration similar to that in FIG. 6. Specifically, in a manner similar to the above, the circuit is largely divided into two right and left portions. The circuits A, C, and D, the first data bus, the circuit E, and the second data bus are provided. The second data bus BUS2 in FIG. 6 extends downward and is connected to the second data bus BUS2 in FIG. 7.

The second data bus BUS is connected to circuits J provided in the center portion of the chip. Output signals of the circuits J are input to circuits F provided in the center portion via signal lines extended in the lateral direction. The circuits F receive the right and left output signals B and T of the circuits J provided in correspondence with the right and second portions of the second data bus BUS2 and output a signal of 9 bits to the output circuit provided in the center portion of the chip.

Figure 8:
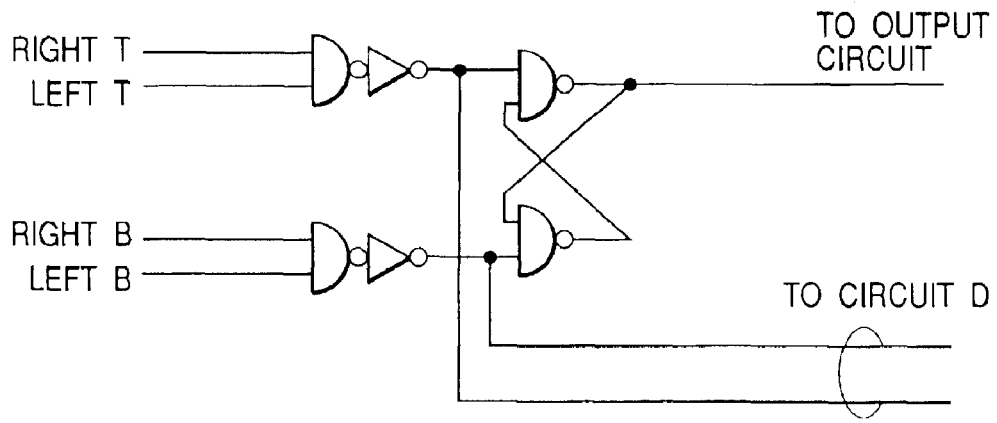
FIG. 8 is a circuit diagram showing an example of a circuit F in FIG. 7.

FIG. 8 is a circuit diagram showing an example of the circuit F. The circuit F is constructed by a latch circuit formed by an NAND gate circuit and a gate circuit provided in the input portion. The gate circuit takes the form of a series circuit of the NAND gate circuit and an inverter circuit and performs an operation of an OR input gate circuit of the logic 0. Specifically, right and left input signals B and T are generated by the circuits J to be described later, and an output signal of a not-selected memory block is set to the high level (logic 1). Consequently, by the low level (logic 0) of any of the signals in a selected memory block, an operation of setting/resetting the latch circuit constructed by the NAND gate circuit is performed.

Complementary input signals of two NAND gate circuits constructing the latch circuit, in other words, output signals of the OR input gate circuit of the logic 0 are supplied to the circuit D to thereby generate the reset signal RES in a manner similar to the above. By the reset signal RES, the self reset operation of the second data bus BUS2 is performed. Since the second data bus BUS2 is disposed in the same position like the first data bus BUS1, signal propagation delay in the buses 0 to n becomes almost the same delay time irrespective of the operation conditions (device, temperature, and the like). Consequently, also in the case where reset signals are generated from a representative bus line and commonly used, the automatic adjusting function of the reset signal generating timing according to the operation conditions as a feature of the inherent self reset circuit is not lost, and inconveniences caused by timing shifts do not occur.

Figure 9:
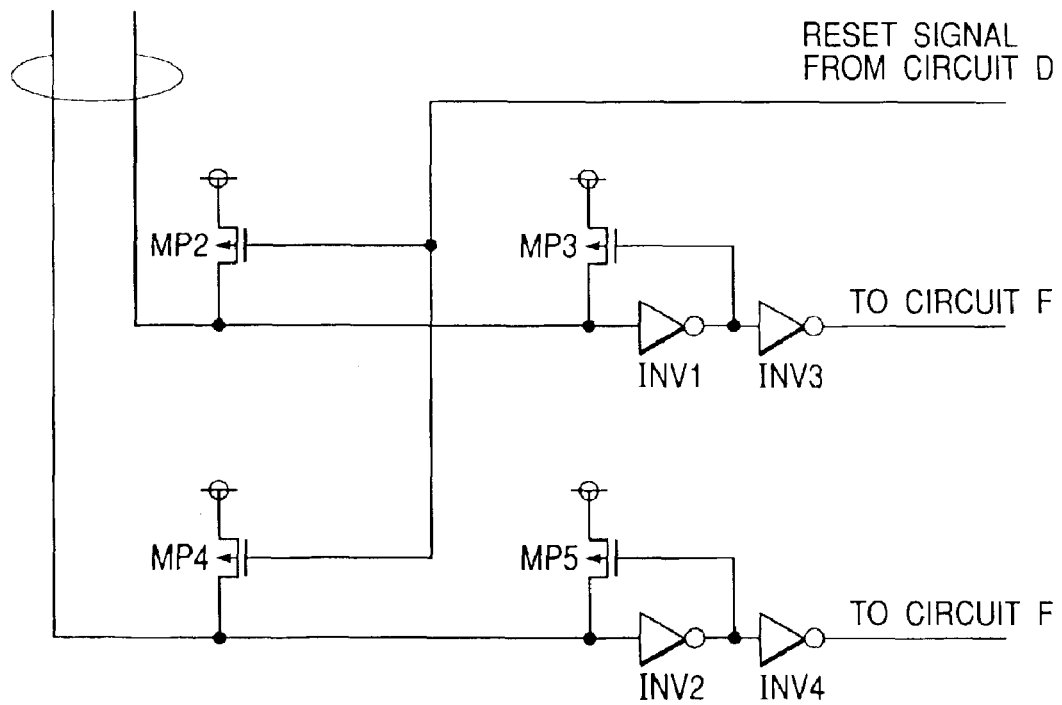
FIG. 9 is a circuit diagram showing an example of a circuit J in FIG. 7.

FIG. 9 is a circuit diagram of an example of the circuit J. The circuit J is basically the same as the circuit C. Consequently, the same reference numerals and characters are designated to the P-channel MOSFETs MP2 to MP5 and relay amplification circuits INV1 and INV2 provided for the second data bus as those in the circuit C. To the relay amplification circuit, inverter circuits INV3 and INV4 are added. By the two inverter circuits, positive phase amplification is performed. As feedback signals to the P-channel MOSFET provided to maintain the precharge level of the second data bus, inverted amplification signals generated by the inverter circuits INV1 and INV2 in the preceding stage are used like the circuit C.

By performing the positive phase amplifying operation in the relay amplification circuit, a signal of the second data bus which is set in the precharge level is output as a high-level signal, and a signal of the discharged bus is output as a low-level signal. To be specific, all of signals becomes the high level (logic 1) in the second data bus BUS2 which is not selected. In the circuit F of FIG. 8, in response to an input of the low level of T or B transmitted from the selected second data bus, the latch circuit performs set/reset operation.

By dividing the read data bus into two portions for one memory block as described above, the length of the lines is shortened, parasitic capacitance of the first data bus BUS1 is reduced, and the signal transfer speed (discharge/precharge) is increased. The configuration of automatically transmitting a signal of a data bus selected by the OR can simplify a defect repairing circuit as described below.

Figure 10:
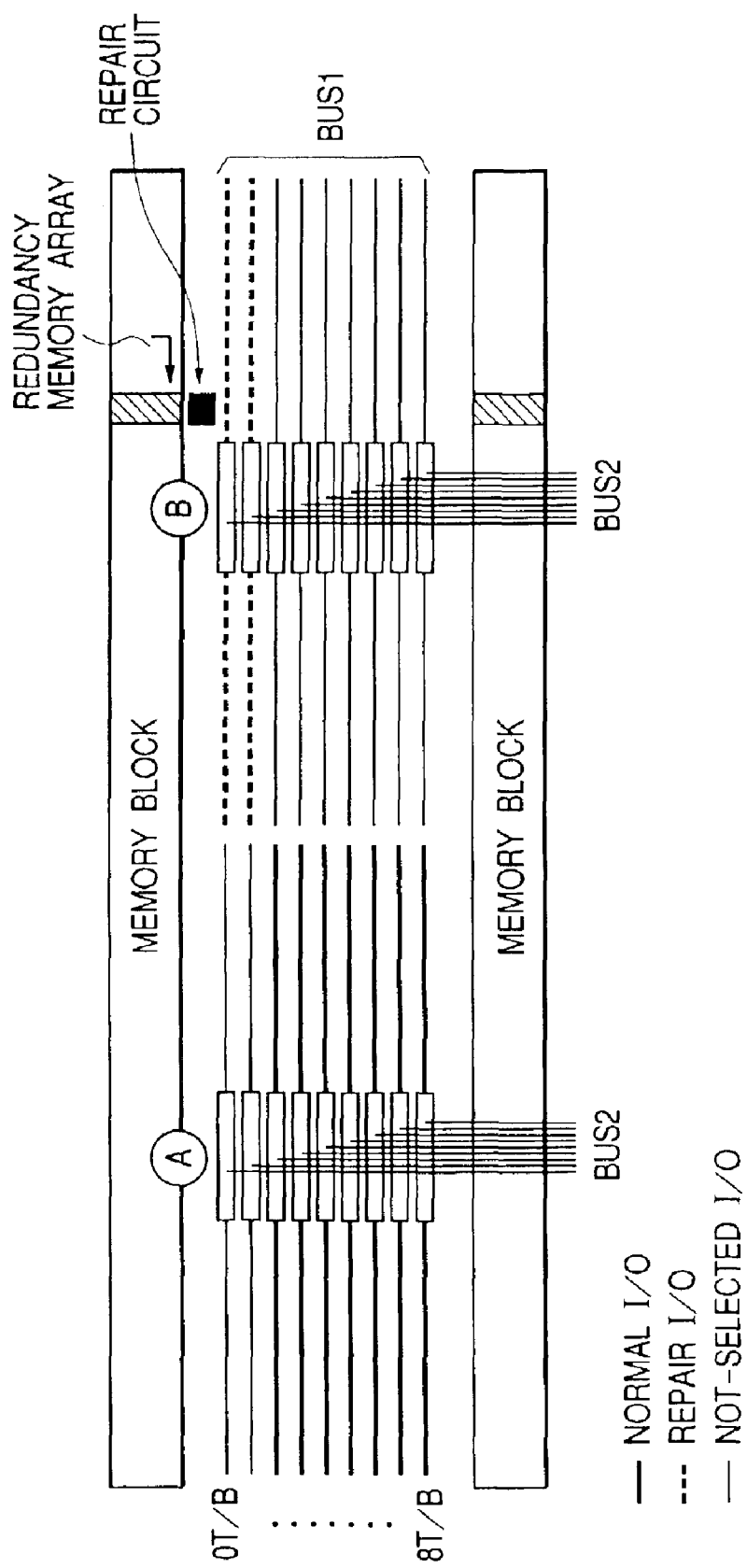
FIG. 10 is a bus configuration diagram showing an example of a Y defective circuit in an SRAM according to the invention.

FIG. 10 is a bus configuration diagram showing an example of a Y defective circuit in the SRAM according to the invention. A memory block is largely divided into two blocks A and B as in the foregoing embodiment. In each of the blocks A and B, the first data bus BUS1 is divided into two portions in the lateral direction. The circuits C, D, and E are provided in the center portion and led to the second data bus BUS2. The first data bus BUS1 is constructed by nine pairs of signal lines from a bus 0T/B to a bus 8T/B. In the entire memory block, the first data bus BUS1 is divided into equal four portions as two sets.

In the embodiment, a redundancy memory array is provided only on the block B side in the memory block. In correspondence with it, a repair circuit is provided only on the block B side. The diagram shows an example of repairing the block A which does not include a redundancy memory array by using the redundancy memory array on the block B side. For example, a redundancy memory array can repair two I/O buses. In the diagram, in the case where a defect occurs in bit lines corresponding to the data buses 0 and 1 in the memory block A, bit lines of the redundancy memory array in the block B are used.

In the operation of reading a signal from the block A including a bit line defect, the buses 0 and 1 corresponding to the block A are not selected. The redundancy memory array in the block B is selected by the repair circuit and connected to the buses 0 and 1 of the block B. In such a manner, the buses 0 and 1 are selected as repair I/O buses, and the remaining buses 3T/B to 8T/B are not selected.

Via a signal transmission path of the OR configuration, that is, a path of the circuits C, E, J, and F and the output circuit, a selected signal is automatically output irrespective of the blocks A and B. Specifically, the buses which are not selected in the blocks A and B maintain a precharged state. Only a signal corresponding to discharging of the selected bus is led to the output circuit via the first data bus BUS1 and the second data bus BUS2. Therefore, also in the block B which is not selected, only by connecting the redundancy memory array to the buses 0 and 1 via the repair circuit, a signal of the redundancy memory array can be output via the path as described above. In the selected block A, by maintaining the buses 0T/B and 1T/B corresponding to a defective bit line in the precharge state, an output can be stopped.

Figure 11:
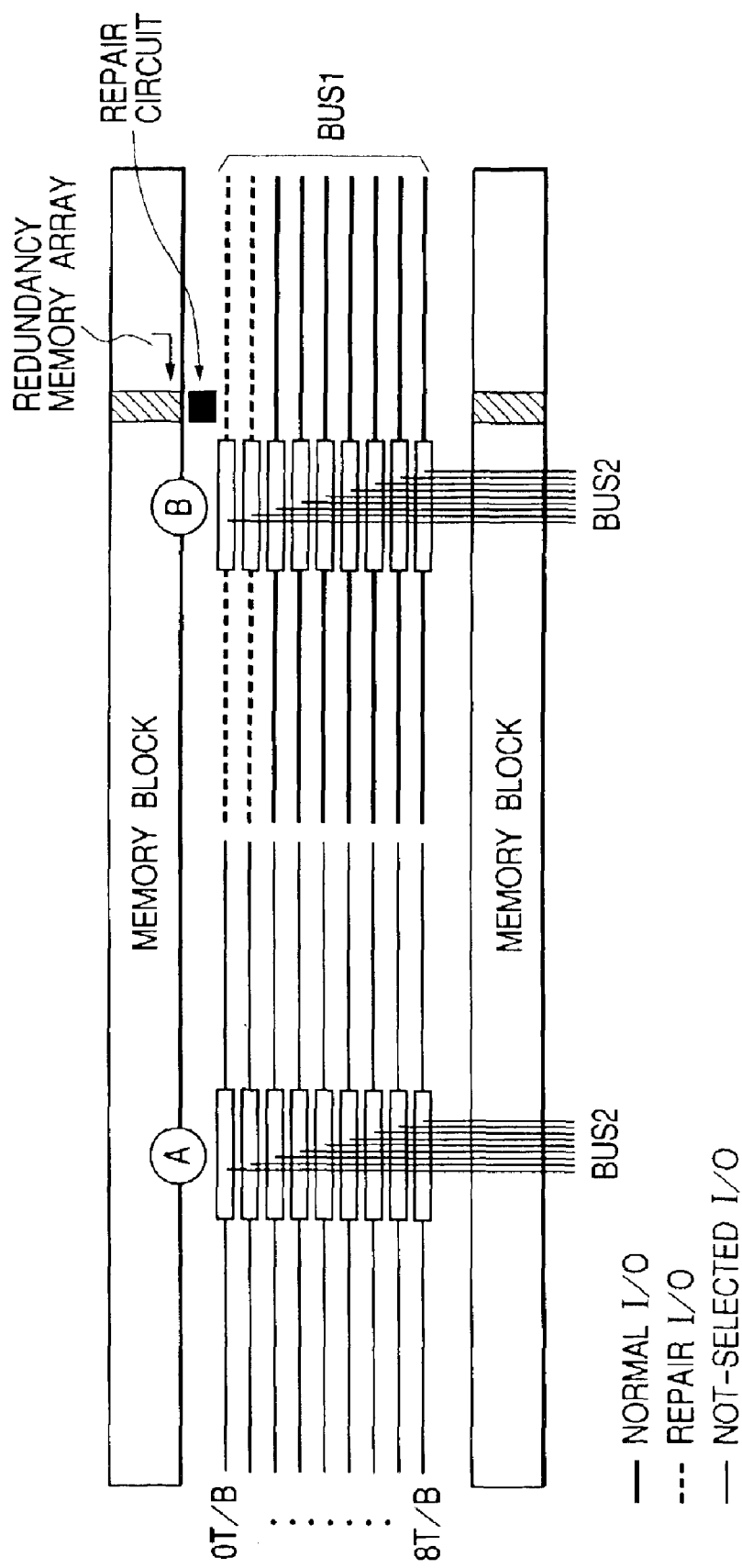
FIG. 11 is a bus configuration diagram showing an example of a Y defective circuit in the SRAM according to the invention.

FIG. 11 is a bus configuration diagram showing an example of a Y defective circuit in the SRAM according to the invention. The diagram shows an example of the case of repairing the block B including the redundancy memory array by a Y defect repairing circuit that is the same as that in FIG. 10. In the example, in the case where a defect exists in bit lines corresponding to the buses 0 and 1 in the block B, the repair circuit connects bit lines of the redundancy memory array to the buses 0 and 1 in place of the defective bit lines in the block B. In the first data bus BUS1, the buses 0T/B and 1T/B are set as repair IO buses. In a manner similar to the normal operation, the first data bus BUS1 in the block B including the repair buses IO is selected and led to the output circuit via the second data bus BUS2 and the circuits J and F.

Figure 12:
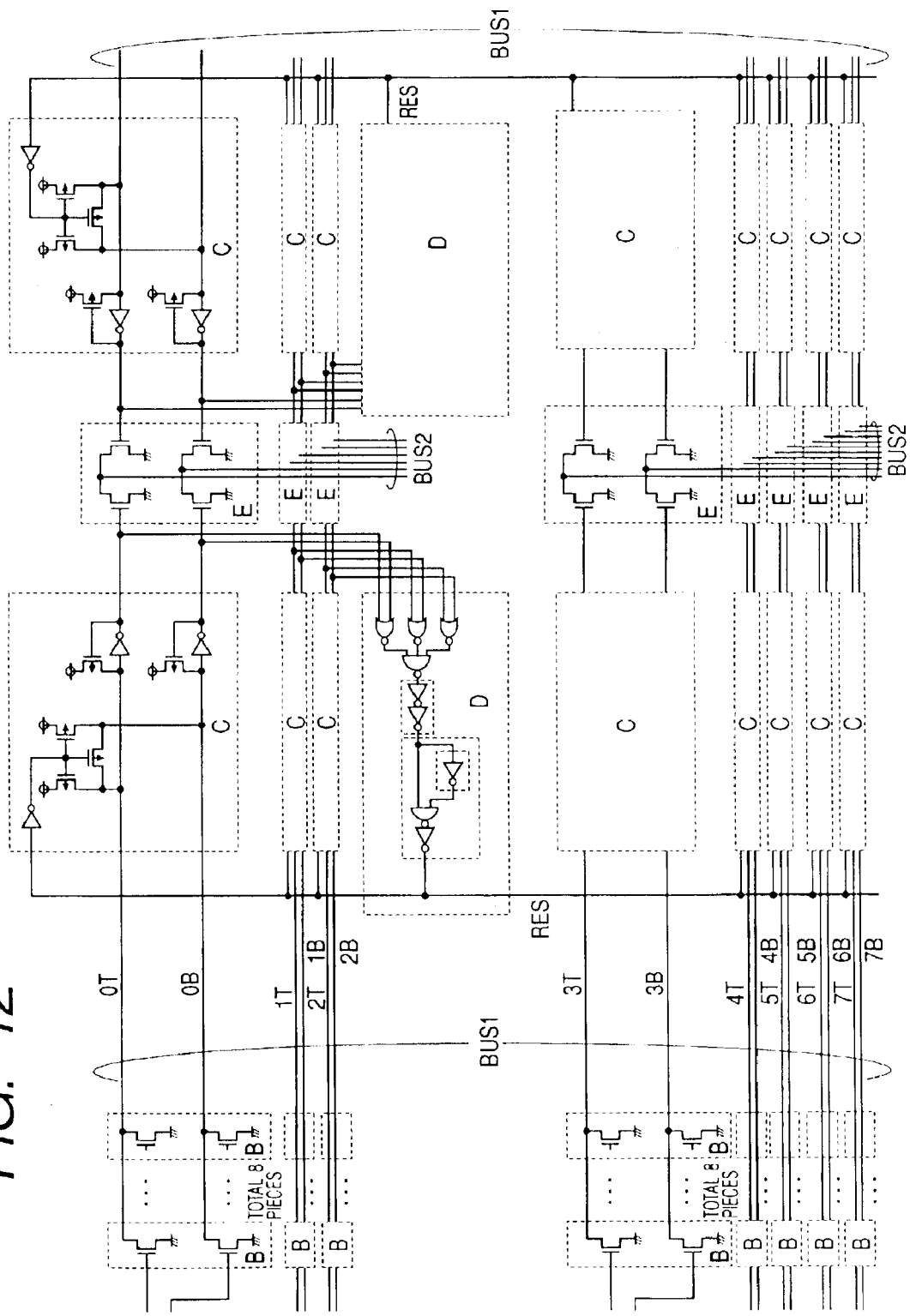
FIG. 12 is a circuit diagram showing an example of a first data bus corresponding to a block A for the Y defective circuit in the SRAM according to the invention.

FIG. 12 is a circuit diagram showing an example of the first data bus corresponding to the block A for the Y defect circuit in the SRAM according to the invention. In the diagram, the circuit B indicates an output MOSFET with an open drain for receiving an output signal of the circuit A. In an example of the defect repair in FIG. 10, in the case where the circuit D provided in the first data bus BUS1 corresponding to the block A receives a signal of the bus 0 or 1 and generates the reset signal RES, a problem such that the reset signal RES is not generated occurs.

To avoid such a problem, in the case of repairing two buses IO, the circuit D corresponding to the block A is constructed to receive signals from buses corresponding to three buses IO more than the two buses, for example, buses 0 to 2. Specifically, three NOR gates NOR are provided so as to receive signals from the two buses 0 to 2. With the configuration, as shown in FIG. 10 where repair is made in the block B, the reset signal RES can be generated from the signals from the bus 2 also in the block A.

Figure 13:
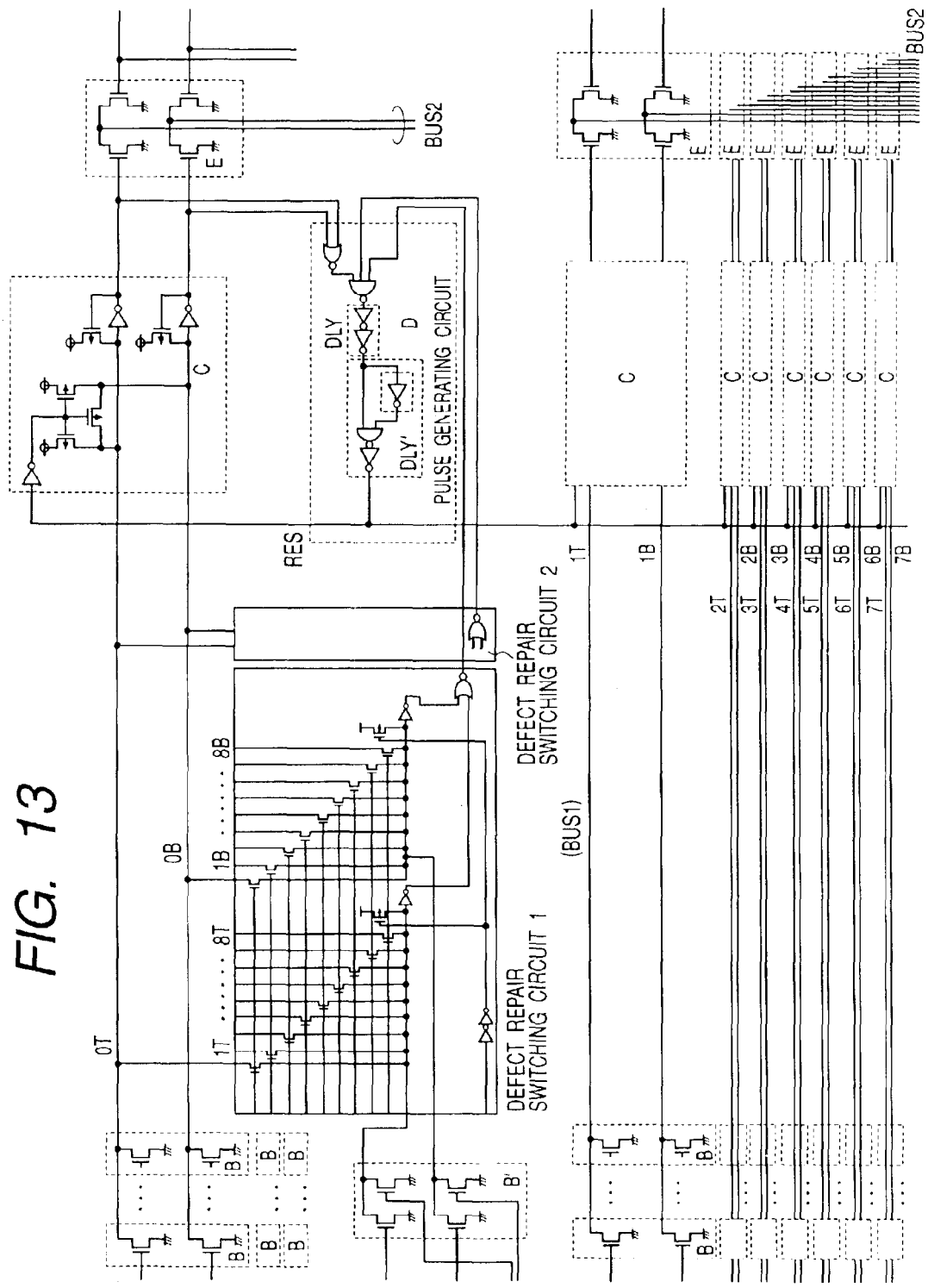
FIG. 13 is a circuit diagram showing an example of the first data bus corresponding to a block B for the Y defective circuit in the SRAM according to the invention.

FIG. 13 is a circuit diagram showing an example of a first data bus corresponding to the block B directed to the Y defective circuit in the SRAM according to the invention. In the example of the defect repair in FIG. 10, even when any of the buses 0T/B to 8T/B is used by the repair circuit to repair a defective bit line in the block A, the circuit D in the block B has to generate the reset signal RES. An MOS switch enabling the drain of an MOSFET constructing an output circuit B' corresponding to the redundancy memory array to be connected to any of the first data buses 0T/B to 8T/B is provided and defect repair switching circuits 1 and 2 are constructed.

In the case where the bus 0T/B is used as in the example of the diagram, a selection signal is supplied to the gate of an MOS switch corresponding to the bus 0T/B. A discharge signal of the bus 0T or B of the first data bus by the output circuit B' is input to the circuit D thorough the inverter circuit and the NOR gate circuit. A similar signal is generated also from the other defect repair switching circuit 2 and input to the circuit D. The circuit D receives also a signal representing the bus 0 including the redundancy memory array from the block B itself and generates the reset signal RES.

With the configuration, in the circuit D on the block B side, in the selecting operation involving the redundancy memory array from the block B, the buses 0 to 8 always enter a selected state. By a signal representing one of the buses, the reset signal RES is generated. Also in the case where the redundancy memory array in the block B is used for repairing the block A, in response to signals from the defect repair switching circuits 1 and 2, the reset signal RES can be generated.

Figure 14:
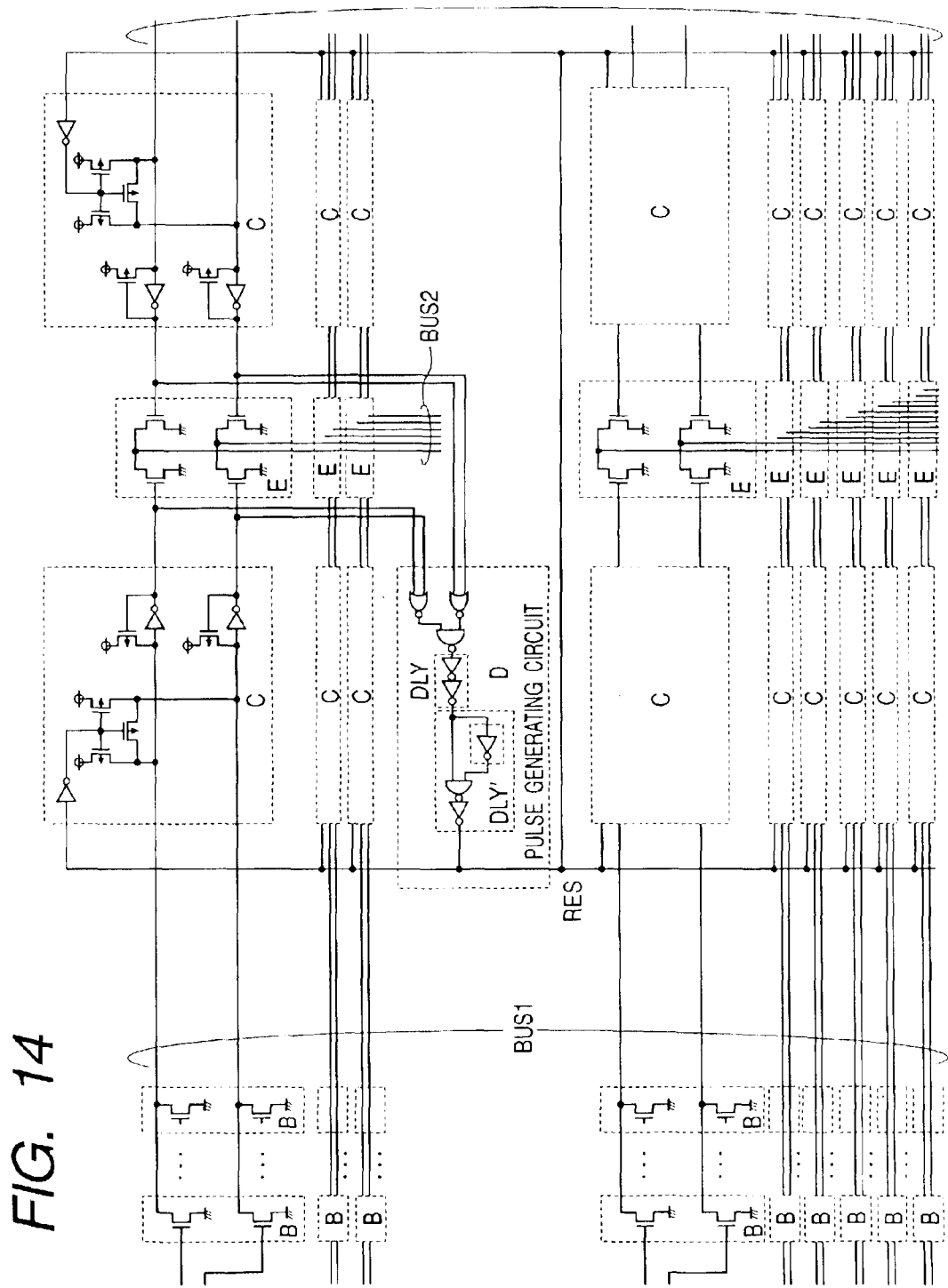
FIG. 14 is a circuit diagram showing another example of a first data bus of the SRAM according to the invention.

FIG. 14 is a circuit diagram showing another example of the first data bus of the SRAM according to the invention. In the example, the circuit D is used for both right and left portions of the first data bus BUS1. Consequently, the circuit D has two NOR gate circuits for receiving signals from one bus disposed while sandwiching the circuit E. The reset signal RES generated by the circuit D is supplied commonly to the circuits C provided on both sides of the circuit E. In such a manner, the circuit can be simplified.

Figure 15:
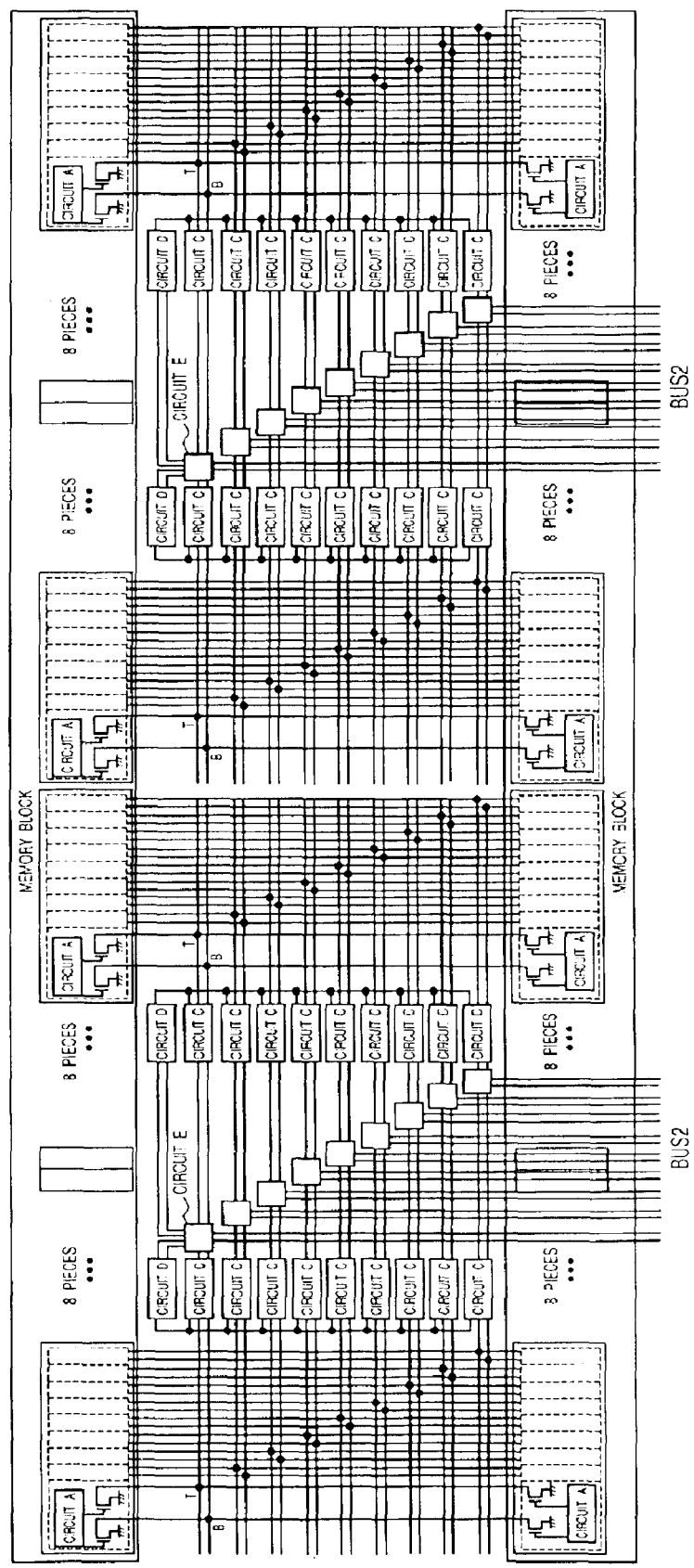
FIG. 15 is another circuit configuration diagram of two memory blocks in the upper part of the memory array in FIG. 5 and their peripheral circuits.
Figure 16:
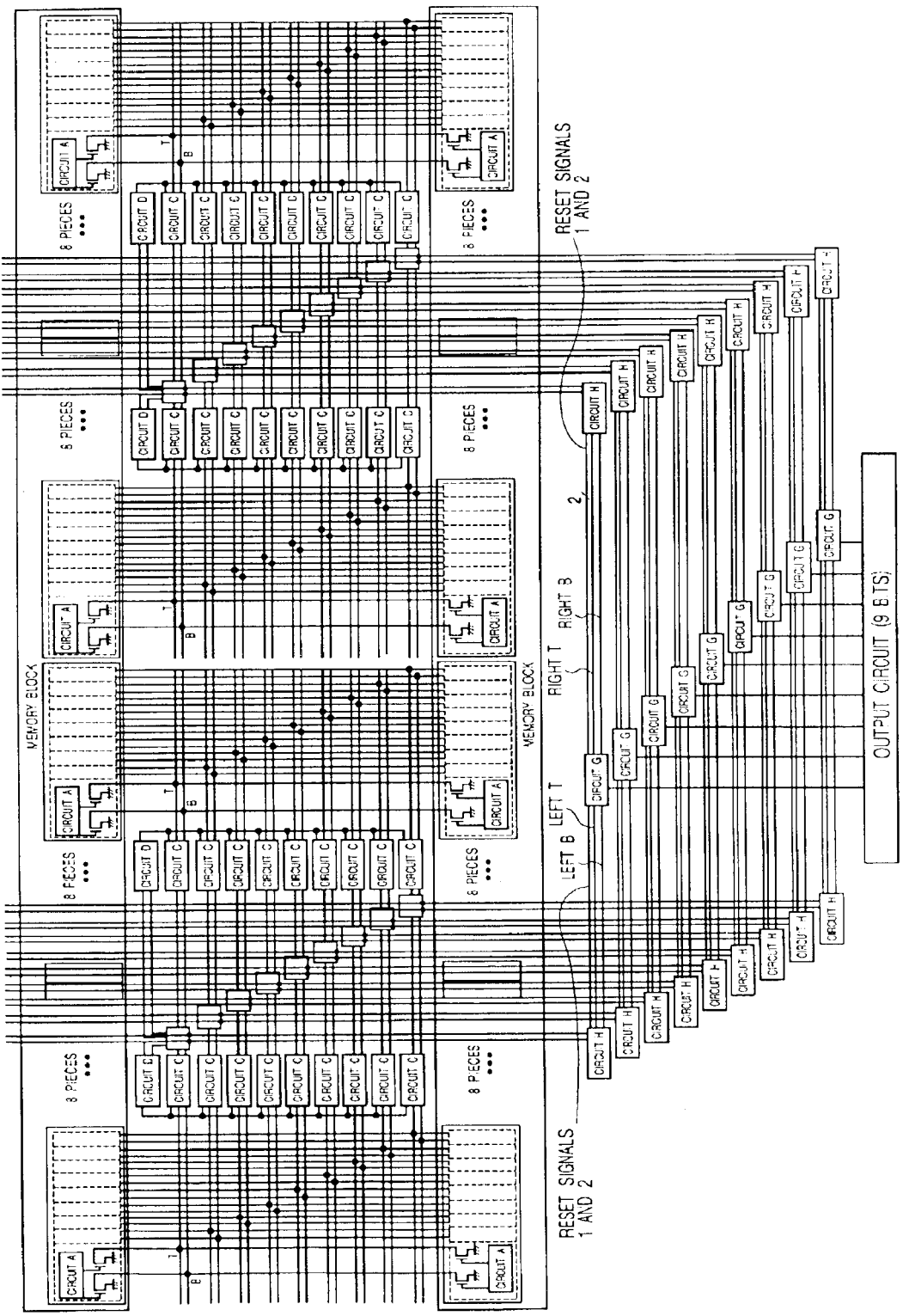
FIG. 16 is another circuit configuration diagram of two memory blocks in the lower part of the memory array in FIG. 5, their peripheral circuits, and an output circuit.

FIGS. 15 and 16 are configuration diagrams showing another example of memory blocks of the SRAM to which the invention is applied and their peripheral circuits. FIGS. 15 and 16 are modifications of FIGS. 6 and 7 and correspond to one memory array in the chip configuration shown in FIG. 5.

FIG. 15 shows two memory blocks in the upper part and peripheral circuits corresponding to the two memory blocks and the whole configuration is largely divided into the right and left parts like FIG. 6. In the left half, a memory array is provided in correspondence with the circuit A. Total 16 sets each consisting of nine circuits A are provided. Eight sets are provided in each of the upper and lower memory blocks while sandwiching the circuits E.

The corresponding circuits A in the upper and lower memory blocks are connected to the nine pairs of buses 0 to 8 constructing the first data bus BUS1 extending in the lateral direction. Specifically, the nine pairs of signal lines extending in the lateral direction in the diagram construct the first data bus. To each of the buses T and B, the drains of the corresponding eight output MOSFETs are connected.

The circuits C are provided in correspondence with the right and left divided portions of the first data bus and one circuit D is provided for nine circuits C to generate a reset signal. The circuit E receives output signals of two circuits C in the right and left divided portions of the first data bus and transmits output signals to the second data bus BUS2 extended in the vertical direction. Also in the right half of the memory block, with a mirror configuration of the left half, the other divided portion in the first data bus and the circuits C and D are provided. In the center portion in the lateral direction, the circuits E and the second data bus BUS2 are provided.

FIG. 16 shows the two memory blocks in the lower part of the divided four memory blocks, their peripheral circuits, and an output circuit. The two memory blocks in the lower part have a configuration similar to that of FIG. 15. Specifically, the whole configuration is largely divided into the right and left two portions. The circuits A, C, and D, the first data bus, the circuit E, and the second data bus are provided. The second data bus BUS2 in FIG. 15 extends downward and is connected to the second data bus BUS2 in FIG. 16.

The second data bus BUS is connected to circuits H provided in the center portion of the chip. Output signals of the circuits H are input to circuits G provided in the center portion via signal lines extended in the lateral direction. The circuits G receive right and left output signals B and T of the circuits H provided in correspondence with the divided right and left portions of the second data bus BUS2 and output a signal of nine bits to the output circuit provided in the center portion of the chip.

Figure 17:
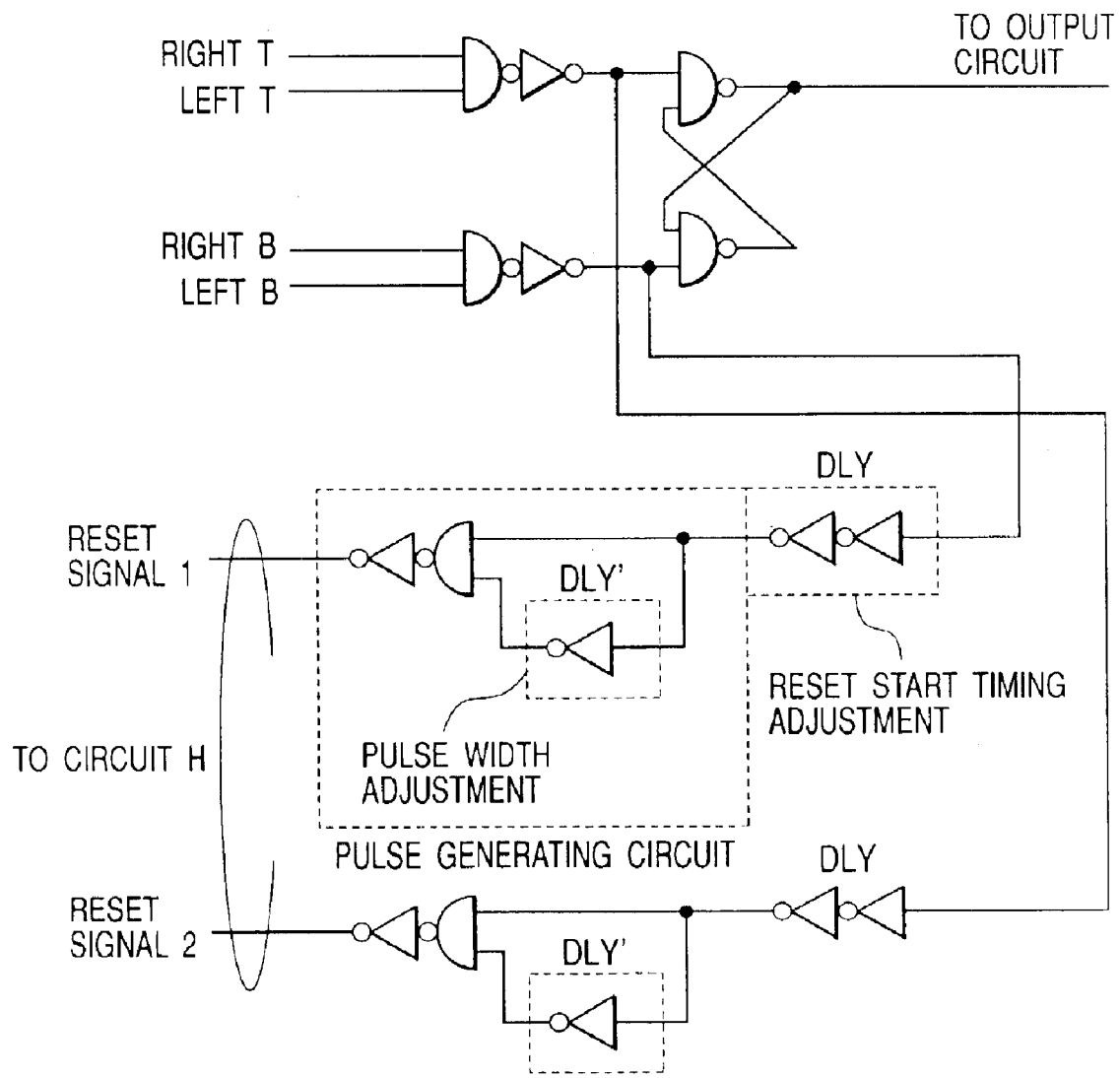
FIG. 17 is a circuit diagram showing an example of a circuit G in FIG. 16.

FIG. 17 is a circuit diagram showing an example of the circuit G. The circuit G is basically similar to the circuit F in FIG. 7 and is constructed by a latch circuit formed by a NAND gate circuit and a gate circuit provided in an input portion. The gate circuit is constructed by a series circuit of a NAND gate circuit and an inverter circuit and operates as an OR input gate of the logic 0. Specifically, the right and left input signals B and T are generated by the circuit H to be described later, and an output signal of a not-selected memory block is set to the high level (logic 1). Therefore, by the low level (logic 0) in signals of a selected memory block, an operation of setting/resetting the latch circuit constructed by the NAND gate circuit is performed.

Complementary input signals of the two NAND gate circuits constructing the latch circuit, in other words, output signals of the OR input gate circuit of the logic 0 are supplied to a circuit similar to the circuit D, two set signals 1 and 2 are generated in a manner similar to the above, and an operation of self-resetting each of the buses T and B in the second data bus BUS2 is performed.

Figure 18:
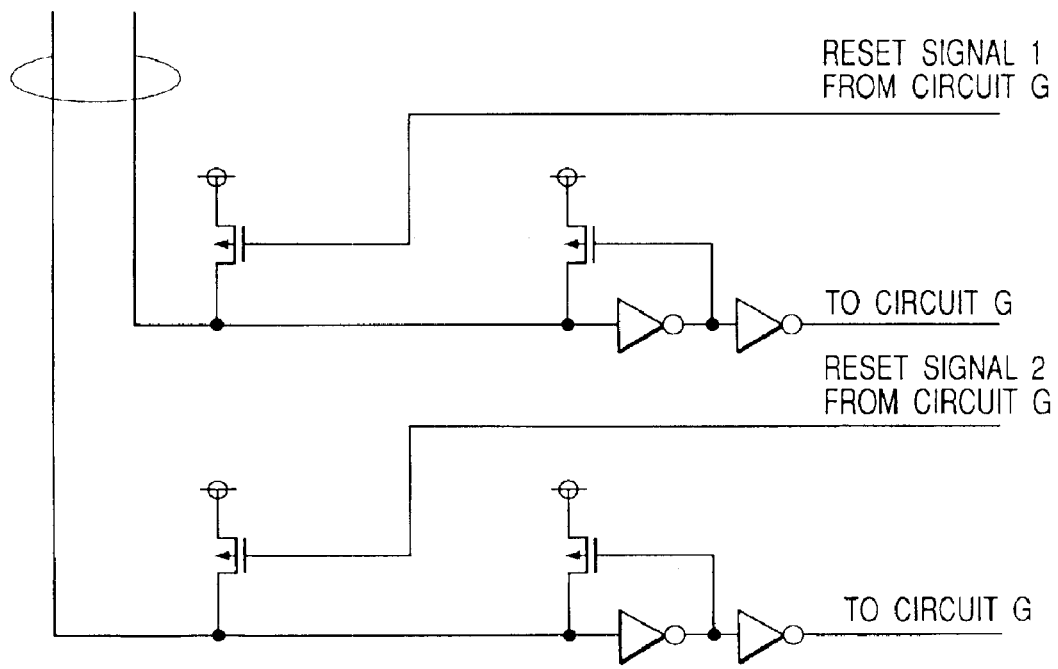
FIG. 18 is a circuit diagram showing an example of a circuit H in FIG. 16.

FIG. 18 is a circuit diagram showing an example of the circuit H. The circuit H is basically similar to the circuit J.

The same reference numerals and characters as those in the circuit C are used for the P-channel MOSFETs MP2 to MP5 provided for the second data bus and the relay amplification circuits INV1 and INV2. Like the circuit J, the inverter circuits INV3 and INV4 are added to the relay amplification circuits, and positive phase amplification is carried out by the two inverter circuits. To the gates of the P-channel MOSFETs for precharging, two reset signals 1 and 2 generated by the circuits G are supplied.

In embodiment, the reset signal 1 or 2 generated in correspondence with a discharged bus is generated so as to reset (precharge) the discharged bus. The reset signal 1 or 2 is generated in correspondence with only one of the buses T and B. With the configuration, only a voltage applied to the gate of the precharge MOSFET corresponding to the bus T or B which does not need the resetting operation changes, so that power consumption can be reduced.

In the invention, by using outputs of specific buses of which number is limited as reset or equalize signals, the number of circuit devices can be reduced and the circuit area and current consumption can be reduced more than the case of providing reset control circuits for all of buses. In addition, timings of the reset start time and the data bus reset period can be designed independently of each other, so that the bus cycle can be shortened.

In the Y defect repair circuit, a redundancy memory cell array is disposed only in the right memory block and is commonly used by the memory blocks on both sides, thereby realizing efficient repairing. Although there are two types of buses; a bus on the side of which the redundancy memory cell array exists, and a bus on the side of which the redundancy memory cell array does not exist, this can be addressed by generating a reset pulse from the repair circuit at the time of repairing a defect. On the side where the redundancy memory cell array does not exist (block A), by generating reset signals from buses of the number obtained by adding the number of buses to be repaired and a pair of buses, at least one bus always operates. Thus, the resetting operation can be assured. On the side where the redundancy memory cell array exists (block B), a reset signal is generated from a specific pair of buses in normal time and is generated from the repair circuit at the time of repair. With such a configuration, a bus can be reset in both of the normal time and the defect repairing time.

Although the invention achieved by the inventor herein has been concretely described on the basis of the embodiments, obviously, the invention is not limited to the foregoing embodiments but can be variously changed without departing from the gist. For example, as the circuit A, not necessarily a circuit of amplifying a signal read from a memory array in which static memory cells are provided, a memory circuit such as a register or a ROM, a circuit for outputting a signal generated by a processor, a logic circuit, or the like, or a combination of the circuits may be used. In this case, it is sufficient to select one of the plurality of circuits A connected to the buses. The invention can be widely used for various semiconductor integrated circuit devices having signal buses through which data is transferred in on the unit basis of plural bits.

An effect obtained by a representative one of the inventions disclosed in the specification will be described briefly as follows. A semiconductor integrated circuit device is provided with a signal transmission path for transmitting a signal by discharging one of first signal lines corresponding to complementary input signals in a plurality of first signal lines precharged by a precharge circuit, and a self reset circuit for detecting the discharge level of the pair of signal lines corresponding to the complementary signals in the plurality of first signal lines and operating the precharge circuit at a timing later than the period of discharging. With the configuration, the circuit area and current consumption can be reduced.

What is claimed is:

1. A semiconductor integrated circuit device comprising:
a plurality of first signal line pairs to which a plurality of complementary signals are transmitted;
a plurality of precharge circuits provided for said plurality of first signal line pairs;
a signal output circuit for outputting a transmission signal by performing discharging, on the basis of complementary input signals, one of signal lines in said first signal line pair to which a precharge voltage is applied; and
a self reset circuit for operating said plurality of precharge circuits on the basis of a result of detection of the discharge levels of a pair of signal lines of said plurality of first signal line pairs.

2. The semiconductor integrated circuit device according to claim 1, further comprising:
an inversion amplification circuit for receiving each of transmission signals of said plurality of first signal line pairs; and
a positive feedback MOSFET for receiving an output signal of the inversion amplification circuit and, when level of said first signal line pair corresponding to the output signal is a precharge level, maintaining the precharge level,
wherein said self reset circuit receives an output signal of said inversion amplification circuit.

3. The semiconductor integrated circuit device according to claim 2, wherein said self reset signal includes a delay circuit for starting a precharging operation at a timing later than a period of discharging said transmission signal, and a pulse generating circuit for receiving a delay signal of said delay circuit and setting said precharge period.

4. The semiconductor integrated circuit device according to claim 3,
wherein said output circuit is constructed by a first MOSFET with an open drain,
wherein an output signal of said inversion amplification circuit is supplied to a gate of a second MOSFET with an open drain, and
wherein the drain of the second MOSFET is connected to a second signal line pair extending in a second direction orthogonal to a first direction in which said first signal line pair extends.

5. The semiconductor integrated circuit device according to claim 4,
wherein drains of a plurality of first MOSFETs are connected to said first signal line pair to obtain a wired logic, and
wherein drains of a plurality of second MOSFETs are connected to said second signal line pair to obtain a wired logic.

6. The semiconductor integrated circuit device according to claim 5,
wherein for said first signal line pair, a set of a first signal line and another first signal line extending in the same direction is provided,
wherein drains of said second MOSFET corresponding to said one first signal line and said second MOSFET corresponding to said another first signal line are commonly connected to said second signal line pair.

7. The semiconductor integrated circuit device according to claim 6,
wherein a first MOSFET provided for said one first signal line is constructed by a plurality of normal MOSFETs,
wherein a first MOSFET provided for said another first signal line is constructed by a plurality of normal MOSFETs and a redundancy MOSFET,
wherein said redundant MOSFET is used also to repair any of the normal MOSFETs provided for said one first signal line, and
wherein a self reset circuit provided for said another first signal line operates also when said first signal line is selected by a predetermined redundancy signal.

8. The semiconductor integrated circuit device according to claim 6, further comprising a precharge circuit and a self reset circuit corresponding to the precharge circuit, to each of which complementary signals of said second signal line are transmitted.

9. A semiconductor integrated circuit device comprising:
a plurality of memory cells;
a first signal line pair for transmitting a first signal read from a corresponding memory cell in said plurality of memory cells;
a second signal line pair for transmitting a second signal read from a corresponding memory cell in said plurality of memory cells;
a first precharge circuit for precharging said first signal line pair to a predetermined voltage;
a second precharge circuit for precharging said second signal line pair to a predetermined voltage; and
a circuit for detecting a signal level of said first signal line pair and operating said first and second precharge circuits to precharge said first and second signal line pairs to said predetermined voltage on the basis of a result of the detection.

10. The semiconductor integrated circuit device according to claim 9, further comprising:
a pair of first MOS transistors each having a drain connected to said first signal line pair, a source connected to a first voltage, and a gate for receiving a first complementary signal; and
a pair of second MOS transistors each having a drain connected to said second signal line pair, a source connected to said first voltage, and a gate for receiving a second complementary signal.

11. The semiconductor integrated circuit device according to claim 10,
wherein said first voltage is a ground potential, and
wherein said pair of first MOS transistors and said pair of second MOS transistors are N-type MOSFETs.

12. The semiconductor integrated circuit device according to claim 10, wherein said predetermined voltage is a power source voltage.

13. A semiconductor integrated circuit device comprising:
a first signal line pair for transmitting a pair of first signals;
a second signal line pair for transmitting a pair of second signals;
a first precharge circuit for precharging said first signal line pair to a predetermined voltage;
a second precharge circuit for precharging said second signal line pair to a predetermined voltage; and
a circuit for detecting occurrence of a potential difference between the signal lines in said first signal line pair and controlling said first and second precharge circuits so as to precharge said first and second signal line pairs to said predetermined voltage on the basis of a result of the detection.

14. The semiconductor integrated circuit device according to claim 13, further comprising:
   a pair of first MOS transistors each having a drain connected to said first signal line pair, a source connected to a first voltage, and a gate for receiving a first complementary signal; and
   a pair of second MOS transistors each having a drain connected to said second signal line pair, a source connected to said first voltage, and a gate for receiving a second complementary signal.

15. The semiconductor integrated circuit device according to claim 14,
   wherein said first voltage is a ground potential, and
   wherein said pair of first MOS transistors and said pair of second MOS transistors are N-type MOSFETs.

16. The semiconductor integrated circuit device according to claim 14, wherein said predetermined voltage is a power source voltage.

17. The semiconductor integrated circuit device according to claim 13, further comprising a plurality of memory cells,
   wherein said pair of first signals and said pair of second signals are signals corresponding to signals read from said plurality of memory cells.

* * * * *